US009577599B2

(12) United States Patent
Berberich et al.

(10) Patent No.: US 9,577,599 B2
(45) Date of Patent: Feb. 21, 2017

(54) PRODUCTION-PROCESS-OPTIMIZED FILTER DEVICE

(71) Applicant: Continental Automotive GmbH, Hannover (DE)

(72) Inventors: Reinhold Berberich, Frankfurt (DE); Jörg Dammköhler, Kelkheim (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 86 days.

(21) Appl. No.: 14/410,141

(22) PCT Filed: Jun. 27, 2013

(86) PCT No.: PCT/EP2013/063487
§ 371 (c)(1),
(2) Date: Dec. 22, 2014

(87) PCT Pub. No.: WO2014/001441
PCT Pub. Date: Jan. 3, 2014

(65) Prior Publication Data
US 2015/0341010 A1   Nov. 26, 2015

(30) Foreign Application Priority Data

Jun. 27, 2012   (DE) .................. 10 2012 210 998

(51) Int. Cl.
*H03H 7/01* (2006.01)
*H05K 1/02* (2006.01)
(Continued)

(52) U.S. Cl.
CPC ............... *H03H 7/17* (2013.01); *H01F 3/00* (2013.01); *H03H 1/0007* (2013.01);
(Continued)

(58) Field of Classification Search
CPC .... H03H 7/0115; H03H 7/427; H03H 1/0007; H03H 7/17; H05K 1/0216; H05K 1/18; H05K 1/0233; H01F 3/00
(Continued)

(56) References Cited

U.S. PATENT DOCUMENTS 6,160,465 A  * 12/2000  Yamaguchi ............. H01F 17/06
                                                                335/306
7,999,633 B2 *  8/2011  Xu ....................... H03H 1/0007
                                                                333/177
(Continued)

FOREIGN PATENT DOCUMENTS

EP   2 117 285 A1   11/2009
GB   1 249 823      10/1971

OTHER PUBLICATIONS

PCT International Search Report—Jan. 28, 2014.

*Primary Examiner* — Stephen E Jones
*Assistant Examiner* — Rakesh Patel
(74) *Attorney, Agent, or Firm* — Brinks Gilson & Lione

(57) ABSTRACT

A filter device for filtering electrical currents or electromagnetic interference, particularly common-mode interference. The filter device has a soft-magnetic core with a passage, a printed circuit board with a plurality of electronic components, and a holding section. The holding section of the printed circuit board can be put through the core passage wherein the passage is designed such that the holding section and the electronic components arranged on the holding section can be put through the passage.

15 Claims, 4 Drawing Sheets

(51) Int. Cl.
*H05K 1/18* (2006.01)
*H01F 3/00* (2006.01)
*H03H 1/00* (2006.01)
*H05K 9/00* (2006.01)

(52) U.S. Cl.
CPC ......... *H05K 1/0216* (2013.01); *H05K 1/0233* (2013.01); *H05K 1/18* (2013.01); *H05K 9/0066* (2013.01); *H05K 2201/086* (2013.01); *H05K 2201/09081* (2013.01)

(58) Field of Classification Search
USPC ............ 336/175; 333/181, 185, 12; 361/763
See application file for complete search history.

(56) References Cited

U.S. PATENT DOCUMENTS

| 2009/0021091 A1 | 1/2009 | Shino et al. | |
| 2011/0043303 A1* | 2/2011 | Herron | H05K 1/0233 333/181 |

* cited by examiner

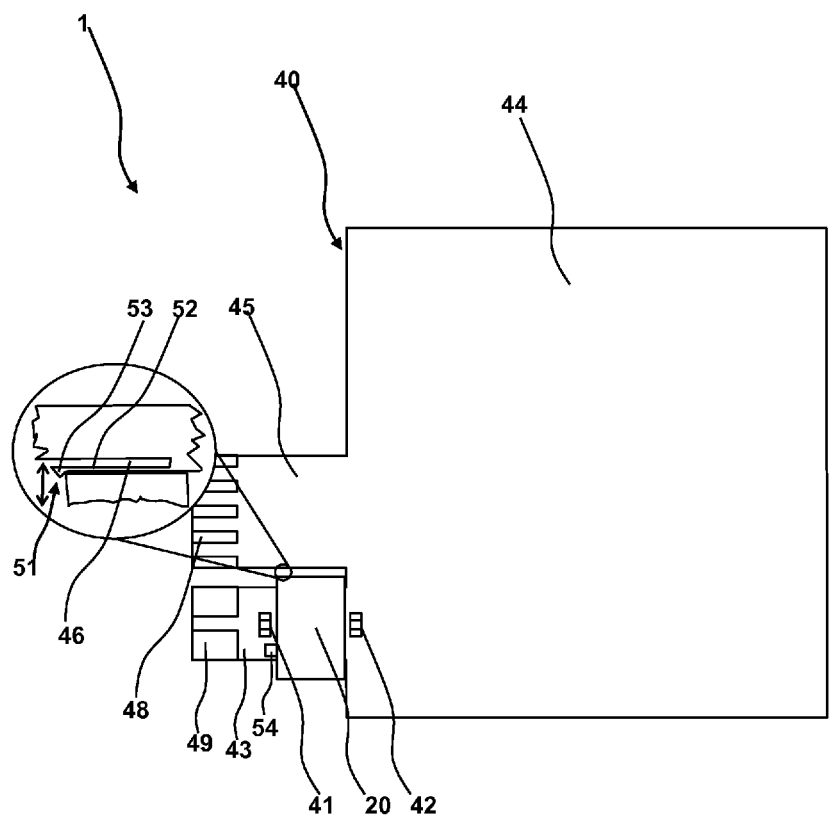

PRODUCTION-PROCESS-OPTIMIZED FILTER DEVICE

CROSS REFERENCE TO RELATED APPLICATIONS

This application claims priority to German Patent Application No. 10 2012 210 998.6, filed on Jun. 27, 2012; and PCT/EP2013/063487, filed Jun. 27, 2013.

FIELD OF THE INVENTION

The present invention relates to a filter device and to a control device for a power-assisted steering apparatus including a filter device according to the invention.

BACKGROUND

The following is known from the prior art: until now, so-called common-mode chokes which consist of two coils wound in opposition to one another and having a soft-magnetic core have been used in particular in supply lines in order to reduce electromagnetic interference. These chokes are generally introduced into the signal path to be filtered by means of soldering or welding.

One disadvantage with this consists in that a design of the circuit arrangement which has been selected once can no longer be optionally populated with such a filter, i.e. it is generally necessary to dispense with the filter in order to change the design of the circuit arrangement. If the circuit arrangements are supplier parts, the customer, as the consumer, cannot decide depending on requirements, whether the circuit arrangement is intended to be populated with a filter or not and is tied to the original design.

O-shaped cores which are pushed over sheet-metal lines, for example, are known. Nonetheless, these need to be sequentially processed and require a large number of individual process steps such as soldering or welding during production. If an effective pi filter which contains a combination of two capacitors and a coil is intended to be formed with such an arrangement, the manufacturing complexity is increased additionally by the application of the individual capacitors, with which contact needs to be made separately by means of welding, soldering, clamping or the like.

Against this background, the object of the invention consists in providing a filter device which can be introduced into electronic control devices using simple means and avoids the abovementioned disadvantages.

SUMMARY AND INTRODUCTORY DESCRIPTION OF THE INVENTION

The above described object is achieved by means of a filter device of the type mentioned at the outset, in which the passage of the core is formed in such a way that the accommodating section and the electronic components arranged on the accommodating section can be passed through the passage.

The invention is based on the basic concept of designing the core in such a way that it can be applied or pushed onto the accommodating section of the printed circuit board even when electronic components are already located on the accommodating section. In this way, first the printed circuit board, in a first step, can be completely populated. Then, the core can be applied to the accommodating section of the printed circuit board, as required. In particular, a pi filter, which necessarily needs to have two capacitors, can be provided in a particularly simple and flexible manner at the same time by means of the filter device according to the invention.

The filter device according to the invention is therefore advantageously in the form of a pi filter and is developed by virtue of the fact that the printed circuit board has a first and a second capacitor, which are electrically connected to one another and which interact with the core for filtering of the radiofrequency currents or electromagnetic interference.

Therefore, an embodiment of the filter device according to the invention in which at least one of the capacitors is arranged in the accommodating section is preferred.

Furthermore, an embodiment of the filter device according to the invention in which the first and second capacitors are arranged on the printed circuit board in such a way as to enclose the core at each of its end sides is advantageous.

Particularly advantageous is an embodiment of the filter device according to the invention in which the first capacitor is arranged on the accommodating section, and the second capacitor is arranged adjacent to the accommodating section. In accordance with this embodiment, the core can only be moved on the accommodating section, with the result that the second capacitor can be protected effectively from damage as a result of sliding of the core.

Furthermore, an embodiment of the filter device according to the invention in which the accommodating section has conductor tracks (traces) for conducting a current, wherein the conductor tracks are arranged in such a way as to run through the passage of the core is advantageous. In this way, the core can be electrically coupled to the conductor track by being applied to the accommodating section or by the accommodating section being passed through the core. Wired coils and additional connecting processes for manufacturing the filter device are no longer necessary. The printed circuit board can therefore be populated with a core without any changes, but can also be used without a core.

Advantageously, the filter device according to the invention is developed by virtue of the fact that the printed circuit board has a main section, and that the accommodating section is in the form of a printed circuit board part protruding from the main section. The embodiment enables particularly simple matching of the accommodating section to the dimensions of the passage of the core without needing in the process to match the shape of the main section of the printed circuit board. In this way, the filter device can also optionally be used without the arrangement of the electronic components on the main section changing.

Particularly preferred in this case is an embodiment of the filter device according to the invention in which a second section of the printed circuit board which protrudes from the main section is arranged adjacent to the accommodating section. The second protruding section can particularly advantageously be used for increasing the mechanical stability of the printed circuit board and furthermore also for more stable fitting of the core on the accommodating section.

Advantageously, the filter device according to the invention is developed by virtue of the fact that the printed circuit board has a fastening device for fastening the core in order to prevent sliding of the core from the intended position.

In a particularly simple manner, this is achieved by an advantageous development of the filter device according to the invention in which the fastening device has a latching element includes a latching arm, which has a latching projection arranged at its free end.

Furthermore, an embodiment of the filter device according to the invention in which the fastening apparatus has a plug-in element which can be plugged in onto the printed circuit board and which can be brought into engagement with a section of the core is advantageous. The plug-in element is preferably capable of being plugged in onto the printed circuit board without a further tool. Once the accommodating section has been passed through the passage of the core, said plug-in element is plugged in onto the printed circuit board so that the core is prevented from sliding out of the accommodating section and preferably also damage to the first capacitor on the accommodating section is prevented. Alternatively, the core can also be secured against sliding by the application of an adhesive.

Advantageously, the filter device according to the invention in accordance with one development has a core, in which the material consists of ferrite. Ferrite is an inexpensive material with which the core can be produced. At the same time, the filter functions can be realized sufficiently with a core consisting of ferrite.

In addition, the object is achieved in accordance with a second aspect of the invention by means of a control device for a power-assisted steering apparatus includes a housing and a filter device in accordance with one of the above embodiments.

The control device according to the invention is advantageously developed in such a way that it has a holding device, which can be fastened to the housing, for fastening the core in order to ensure particularly secure positioning of the core on the accommodating section.

BRIEF DESCRIPTION OF THE DRAWINGS

Further preferred embodiments result from the description below of an exemplary embodiment with reference to figures, in which:

FIG. 2 shows a schematic illustration of the first exemplary embodiment in a second method state.

FURTHER DESCRIPTION OF THE INVENTION

Figure 1A:
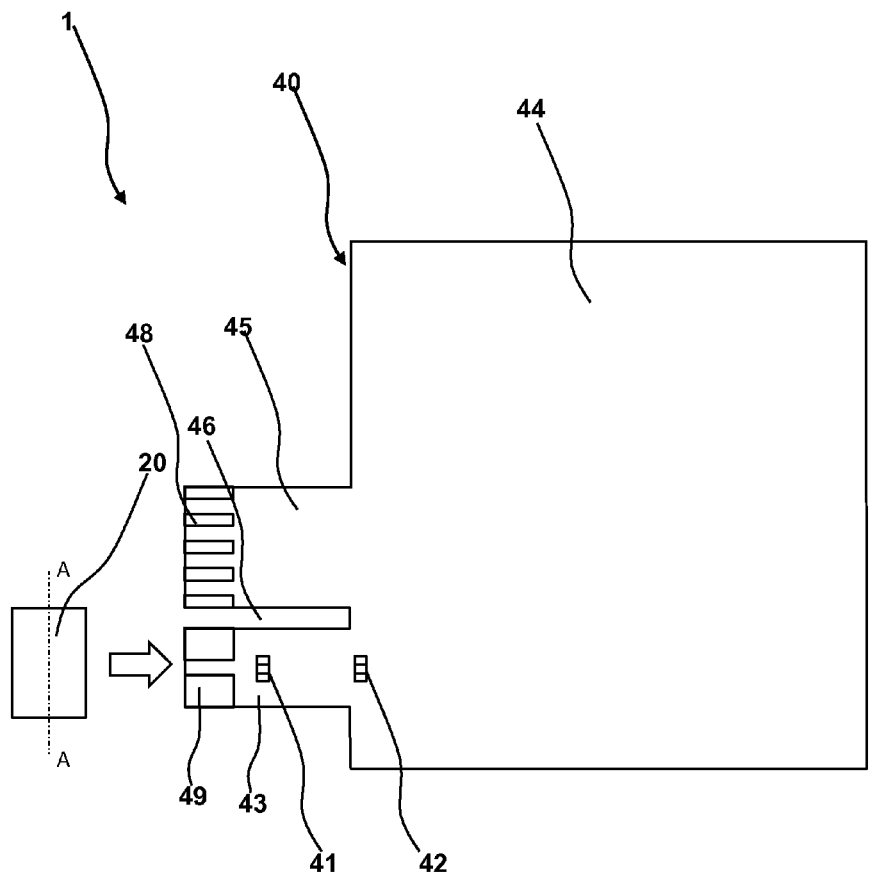
FIG. 1a shows a schematic illustration of the filter device according to the invention in accordance with a first exemplary embodiment in a first method state.
Figure 1B:
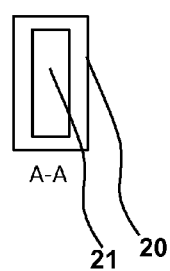
FIG. 1b shows a sectional view of the core along the section line A-A.

FIGS. 1a and 1b show a first exemplary embodiment of the filter device 1 according to the invention for filtering electromagnetic interference, in particular common-mode interference. The filter device has a soft-magnetic core 20 having a passage 21, a printed circuit board 40 includes a plurality of electronic components 41, 42 and an accommodating section 43. The accommodating section 43 of the printed circuit board 41 can be passed through the passage 21. The passage 21 is in this case designed in such a way that the accommodating section 43 and the electronic components 41 arranged on the accommodating section 43 can be passed through the passage 21. The core 20 preferably has a generally rectangular cuboid shape and the core 20 and passage 21 each have a generally rectangular shape. The passage 21 opens at opposite axial ends of the core 20.

Figure 3:
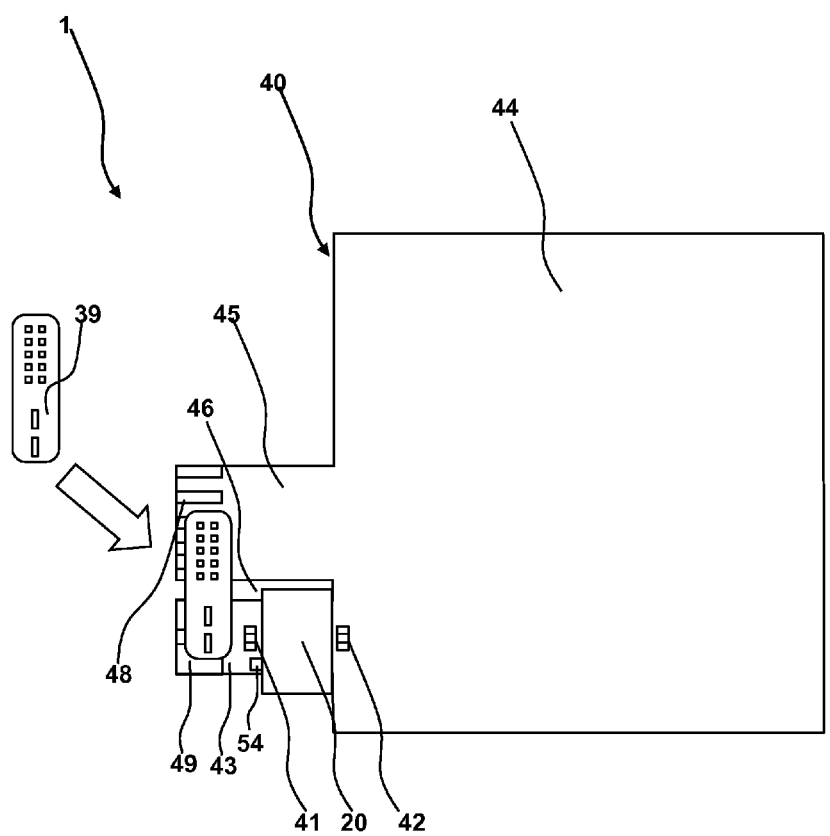
FIG. 3 shows a schematic illustration of the first exemplary embodiment in a third method state.
Figure 4:
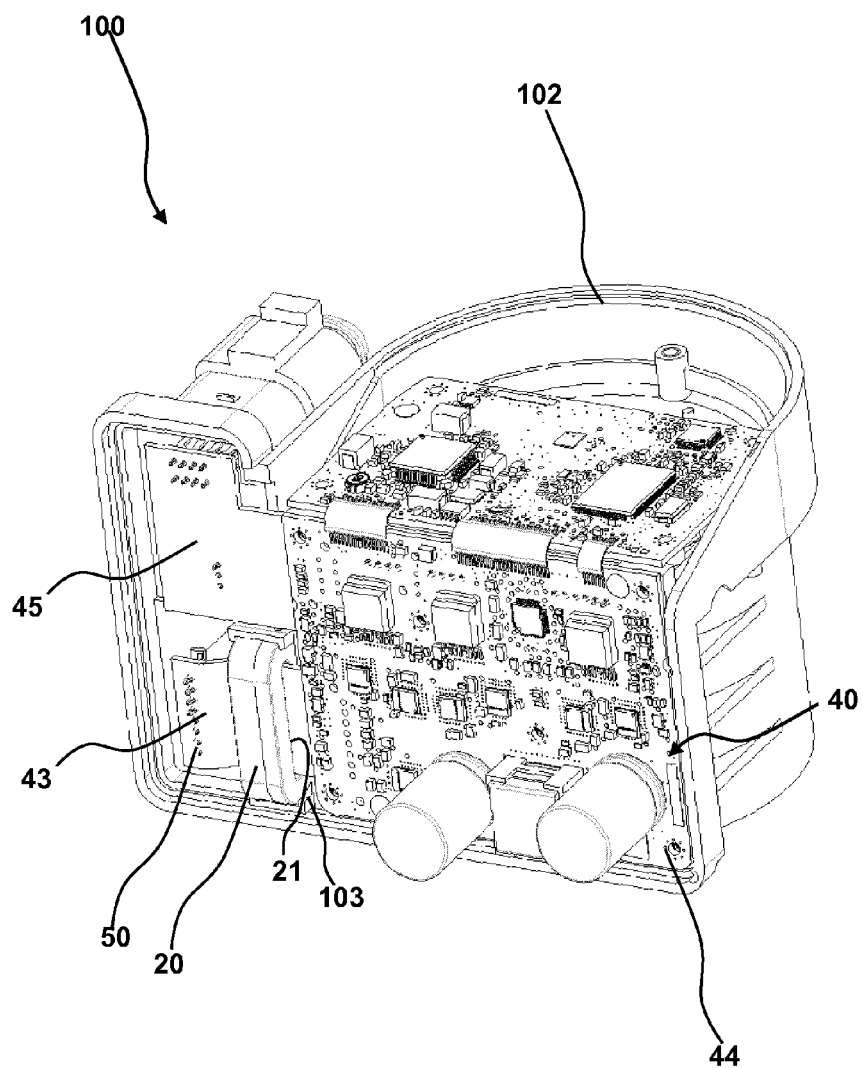
FIG. 4 shows a perspective view of a control device according to the invention in accordance with a first exemplary embodiment.

The printed circuit board (PCB) 40 has a circuit arrangement includes a plurality of electronic components, as illustrated in FIG. 4. FIGS. 1-3 each show only a first and second capacitor by way of example of electronic components 41 and 42.

The printed circuit board 40 has a main section 44, on which the electronic components are arranged for implementing the main function of the printed circuit board 40. In addition, the printed circuit board 40 has the accommodating section 43, which is in the form of a printed circuit board part protruding from the main section 44. A second section 45 of the printed circuit board 40 which protrudes from the main section 44 is arranged adjacent to the accommodating section 43. The individual sections 43, 44, 45 are formed in one piece as a printed circuit board 40.

The accommodating section 43 has a substantially rectangular basic shape, whose width approximately corresponds to the width of the passage 21 of the core 20. The second section 45, also having a rectangular basic shape, is arranged adjacent to section 43, with the result that the two sections form a slot 46 therebetween, in which a fastening device 50 can be arranged, for example. As shown in FIG. 4, the shape of the respective sections 43, 45 can vary, depending on requirements.

In addition, conductor tracks or traces (not shown In the figures) for conducting a current are applied to the accommodating section 43, wherein the conductor tracks are arranged in such a way as to run through the passage 21 of the core 20 when the core 20 has been mounted or pushed onto the accommodating section 43, as shown in FIG. 2. Connection boards (or pads) 49, via which the printed circuit board 40 is connectable to a current (power) source, for example, are located at the free end of the accommodating section 43. The accommodating section 43 can also be used as connector in order to produce an electrical connection to a current source or other devices. It is also conceivable for the free end of the accommodating section 43 to be provided with vias suitable for press-fit connections in order to realize a particularly simple and inexpensive electrical connection to a device connector, for example; see FIG. 3. At the same time as this, the second section 45 can be provided with further contacts 48 for transmitting signals.

The core 20 is produced from a soft-magnetic material, for example ferrite, and is in the form of a ring. The basic shape of the core can vary in this case. In this exemplary embodiment, it is illustrated as being rectangular with a rectangular passage 21, by way of example, as can be seen in the sectional view in FIG. 1b. It can also be formed with rounded corners or with an oval shape. The passage 21 of the core 20 is in this case dimensioned such that the core can be pushed onto the accommodating section 43, even when electronic components 41, in particular a capacitor, are already located on the accommodating section 43.

The electronic components 41, 42 include, inter alia, a first and a second capacitor which are arranged on the printed circuit board 40, and which are electrically connected to one another and interact with the core 20 for filtering interference. The first capacitor 41 is in the form of an input-side filter capacitor and the second capacitor 42 is in the form of an output-side filter capacitor, and the capacitors are already arranged on the printed circuit board 40 prior to the application of the core 20 to the accommodating section 43. Simply by applying or pushing on the core 20, a complete pi filter is produced.

Advantageously, the first capacitor 41 is arranged on the accommodating section 43 and the second capacitor 42 is arranged adjacent to the accommodating section 43. As illustrated in FIG. 2, the core 20 bears against one edge of the printed circuit board 40 and therefore does not come into contact with the second capacitor 42. Capacitor 42 is therefore effectively protected from damage by a sliding core 20. In addition, the first and second capacitors 41, 42 are arranged on the printed circuit board 40 in such a way as to enclose the core 20 at each of its end sides.

The filter device 1 according to the invention has the advantage that an electrical function of a pi filter can be introduced without the need to produce the contact which is normally necessary for this. Therefore, the printed circuit board 40 can optionally be used with different types of cores with different materials and geometry, or else without a core without the circuit arrangement of the electronic components located on the printed circuit board or even of the printed circuit board itself needing to be changed.

In order to prevent sliding of the core 20 on the accommodating section 43, the printed circuit board 40 has a fastening device for fastening the core 20.

Firstly, the fastening device includes a latching element 51. The latching element 51 has a latching arm 52 with a latching projection 53 formed at the free end thereof. The length of the latching arm 52 and the position of the latching projection 53 are such that it comes into engagement with the outer edge of the core 20 as soon as the core 20 has been pushed completely onto the accommodating section 43, as illustrated in FIG. 2. The latching projection 53 has a substantially triangular shape, wherein the contact faces of the projection 53 which are inclined towards the movement direction of the core 20 ensure that the latching arm 52 is bent upwards on contact with the core 20, and the core can be pushed beneath the latching arm 52 or pushed out of the latching arm 52. The latching element 51 can be used for fastening the core 20 only temporarily in a position for the mounting process.

A plug-in element 54 which can be plugged in on the printed circuit board 40 and which can be brought into engagement with a section of the core 20 can be used for final locking or fastening of the core 20. The plug-in element 54 is plugged in onto the printed circuit board 40 as soon as the core 20 is located in the position in which it is pushed onto the accommodating section 43, as shown in FIG. 2. The plug-in element 54 in the plugged-in state protrudes out of the printed circuit board 40 so far that it prevents the movement of the core 20 out of the accommodating section 43.

FIGS. 1-3 furthermore also show individual method steps for producing the filter device according to the invention, which includes the following steps:
a) attaching the first and second capacitors 41, 42 to the printed circuit board 40,
b) pushing the core 20 onto the accommodating section 43,
c) attaching the press-in contact 39 onto the printed circuit board 40.

Optionally, method step b) can be supplemented by a plug-in element 54 being attached to the printed circuit board.

FIG. 4 shows the application of the filter device 1 according to the invention in a control device 100 for a power-assisted steering apparatus includes a housing 102, wherein the filter device 1 is arranged within the housing 102. The core 20 in this exemplary embodiment is by means of a holding device 103, which can be fastened to the housing 102. The holding device 103 includes two holding cushions having two protruding lips, between which the core 20 is set. The holding cushions are preferably formed from an elastic material and can be pressed in between the core 20 and the housing 102 or the second section 45.

While the above description constitutes the preferred embodiment of the present invention, it will be appreciated that the invention is susceptible to modification, variation and change without departing from the proper scope and fair meaning of the accompanying claims.

The invention claimed is:

1. A filter device for filtering electric currents or electromagnetic interference, comprising:
   a soft-magnetic core forming a passage,
   a printed circuit board having a plurality of electronic components and an accommodating section, wherein the accommodating section of the printed circuit board is passed through the core passage,
   wherein the passage is formed in such a way that the accommodating section and at least one of the plurality of electronic components arranged on the accommodating section is passed through the passage,
   in that the printed circuit board has a main section, and in that the accommodating section is in the form of a printed circuit board part protruding from the main section,
   in that a second section of the printed circuit board which protrudes from the main section is arranged adjacent to the accommodating section, and
   the accommodating section and the second section forming a slot therebetween.

2. The filter device as claimed in claim 1, further comprising in that the printed circuit board has the plurality of electronic components in the form of a first and a second capacitor, which are electrically connected to one another and which interact with the core for filtering purposes.

3. The filter device as claimed in claim 2 further comprising in that at least one of the first and second capacitors is arranged on the accommodating section.

4. The filter device as claimed in claim 2 further comprising in that the first and second capacitors are arranged on the printed circuit board in such a way as to enclose the core at each of end sides of the core.

5. The filter device as claimed in claim 2 further comprising in that the first capacitor is arranged on the accommodating section, and the second capacitor is arranged adjacent to the accommodating section.

6. The filter device as claimed claim 1 further comprising in that the accommodating section has conductor tracks for conducting a current, wherein the conductor tracks are arranged in such a way as to run through the passage of the core.

7. The filter device as claimed in claim 1 further comprising the core having a generally rectangular cuboid shape and the core forming a closed cross-sectional figure and the passage opening at opposite axial ends of the core.

8. The filter device as claimed in claim 7 further comprising the core and the core passage each having a generally rectangular cross-sectional shape.

9. The filter device as claimed in claim 1 further comprising in that the printed circuit board has a fastening device for fastening the core in a mounted position on the accommodating section.

10. The filter device as claimed in claim 1 further comprising in that a fastening apparatus has a plug-in element which can be plugged in onto the printed circuit board and which can be brought into engagement with the core.

11. The filter device as claimed in claim 1 further comprising in that the material of the core is ferrite.

12. The filter device as claimed in claim 1 further comprising the filter device incorporated into a control device for a power-assisted steering apparatus comprising a housing.

13. The filter device as claimed in claim 12, further comprising a holding device, which can be fastened to the housing, for fastening the core.

14. A filter device for filtering electric currents or electromagnetic interference, comprising:
- a soft-magnetic core forming a passage,
- a printed circuit board having a plurality of electronic components and an accommodating section, wherein the accommodating section of the printed circuit board is passed through the core passage,
- wherein the passage is formed in such a way that the accommodating section and at least one of the plurality of electronic components arranged on the accommodating section is passed through the passage,
- in that the printed circuit board has a fastening device for fastening the core in a mounted position on the accommodating section, and
- in that the fastening device has a latching element comprising a latching arm, which has a latching projection arranged at a free end thereof and engaging the core in the mounted position.

15. A filter device for filtering electric currents or electromagnetic interference, comprising:
- a soft-magnetic core forming a passage,
- a printed circuit board having a plurality of electronic components and an accommodating section, wherein the accommodating section of the printed circuit board is passed through the core passage,
- wherein the passage is formed in such a way that the accommodating section and at least one of the plurality of electronic components arranged on the accommodating section is passed through the passage,
- in that the printed circuit board has a main section, and in that the accommodating section is in the form of a printed circuit board part protruding from the main section,
- in that a second section of the printed circuit board which protrudes from the main section is arranged adjacent to the accommodating section, and
- the accommodating section and the second section forming a slot therebetween and further comprising a fastening device positioned in the slot for fastening the core in a mounted position on the accommodating section.

* * * * *